(12) United States Patent
Kingsley

(10) Patent No.: US 7,482,886 B1
(45) Date of Patent: Jan. 27, 2009

(54) SYSTEM FOR MEASURING PROPAGATION DELAYS

(75) Inventor: Christopher H. Kingsley, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 109 days.

(21) Appl. No.: 11/784,360

(22) Filed: Apr. 5, 2007

(51) Int. Cl.
*H03K 3/03* (2006.01)
(52) U.S. Cl. .......................................... 331/57; 327/263
(58) Field of Classification Search .................. 331/57; 327/261–263; 326/46
See application file for complete search history.

(56) References Cited

U.S. PATENT DOCUMENTS 6,075,418 A  6/2000  Kingsley et al.
6,650,162 B2 * 11/2003  Dubey ........................ 327/291

* cited by examiner

*Primary Examiner*—Don P Le
(74) *Attorney, Agent, or Firm*—William L. Paradice, III

(57) ABSTRACT

An oscillator circuit includes an enable circuit to generate an initialization signal and includes a ring oscillator responsive to the initialization signal and having a plurality of synchronous elements connected in a loop, wherein each synchronous element comprises a synchronous input terminal, a clock terminal, a first asynchronous input terminal, and an output terminal coupled to the clock terminal of a next synchronous element and coupled to the first asynchronous input terminal of a previous synchronous element. The enable circuit is independent of a delay path of the ring oscillator, and the ring oscillator generates a test clock signal having a period that does not include any signal delays associated with the enable circuit.

20 Claims, 7 Drawing Sheets

SYSTEM FOR MEASURING PROPAGATION DELAYS

FIELD OF INVENTION

This invention relates generally to measuring signal propagation delays, and in particular to measuring signal propagation delays through synchronous circuit elements.

DESCRIPTION OF RELATED ART

Integrated circuit (IC) devices are typically tested before delivery to customers to ensure that the devices meet various performance parameters specified by the IC manufacturer. For example, most IC devices are tested to measure the propagation delays within and between various circuit elements of the device to ensure that the device operates at some minimum specified speed. Many early techniques for measuring device propagation delays employ a tester that provides a test signal to an input pin of the device and receives the test signal from an output pin of the device, wherein the time required for the test signal to propagate from the device's input pin to the device's output pin provides a timing parameter for the device. Unfortunately, such techniques are problematic because many signal paths within an IC device are not directly accessible via its input and output pins. Further, conventional testers typically have tolerances that may have a significant impact on propagation delay measurements, particularly when the path of interest is relatively short.

As a result, some more recent techniques for determining performance parameters of an IC device utilize circuitry within the device to measure propagation delays along various paths of interest in the IC device. For example, U.S. Pat. No. 6,075,418, which is incorporated herein by reference in its entirety, describes a technique in which a number of synchronous elements are configured in a loop to form an oscillator whose output signal is indicative of the delay through the synchronous elements. More specifically, FIG. 1 shows a schematic diagram of a ring oscillator 100 described in U.S. Pat. No. 6,075,418 that may be used to facilitate measurement of signal propagation delays. Oscillator 100 produces an oscillating test signal TCLK having a period that includes the clock-to-out delays of four synchronous components, which are shown in FIG. 1 as control flip-flops 110(1)-110(4). Oscillator 100 includes an oscillator-enable circuit 115 connected to the clock input of flip-flop 110(1) via a test-clock line TCLK. Oscillator-enable circuit 115 includes a flip-flop 120, an OR gate 125, and an AND gate 130. As discussed below with respect to FIG. 2, oscillator-enable circuit 115 produces an edge on test-clock line TCLK when test-enable line TE is brought high. The rising edge on TCLK causes oscillator 100 to begin oscillating. Returning test-enable line TE to logic zero turns oscillator 100 off.

A test-enable signal TE is provided to a synchronous input terminal D0 of flip-flop 120, to an inverted asynchronous input terminal CLR0 of flip-flop 120, and to a first input terminal of AND gate 130. For other embodiments, the D0 input of flip-flop 120 may be connected to a logic one signal (e.g., to VDD). An output terminal Q0 of flip-flop 120 is connected to an inverted input of OR gate 125. The output terminal of OR gate 125 is connected to a second input terminal of AND gate 130 via signal line GQ4. Oscillator-enable circuit 115 also receives a pair of feedback signals Q1 and Q4 from respective flip-flops 110(1) and 110(4), where signal Q1 is provided to the clock input of flip-flop 120 and signal Q4 is provided to a non-inverted input terminal of OR gate 125.

The output terminal Q of each flip-flop 110(1)-110(4) is connected to the clock terminal (>) of a subsequent flip-flop, and to an asynchronous clear terminal (CLR) of a previous flip-flop. For example, output terminal Q2 of flip-flop 110(2) is connected to both the clock terminal of flip-flop 110(3) and to the asynchronous clear terminal CLR1 of flip-flop 110(1). Each rising edge on any given clock terminal thus propagates through to the subsequent flip-flop, and then the subsequent flip-flop clears the preceding flip-flop to prepare the preceding flip-flop for the next rising edge. Each subsequent flip-flop thus acts as a synchronous delay element between the output terminal and the clear terminal of a previous flip-flop. Output Q4 from flip-flop 110(4) is connected via circuit 115 to the clock input terminal of flip-flop 110(1) so that flip-flops 110(1)-110(4) form a ring oscillator that responds to rising clock edges only.

FIG. 2 is a waveform diagram 200 illustrating an operation of oscillator 100 of FIG. 1. Each waveform in FIG. 2 is labeled using the corresponding node designation depicted in FIG. 1, and lines terminating with differently named input and output nodes are named for output nodes. For example, the line connecting output terminal Q2 of flip-flop 110(2) to the clock terminal of flip-flop 110(3) and the clear terminal of flip-flop 110(1) is labeled "Q2." The node designations are hereafter used to alternatively refer to circuit nodes or their corresponding signals. In each instance, the interpretation of the node designations as either signals or physical elements will be clear from the context.

Initially, all flip-flops 110(1)-110(4) are cleared to initialize their outputs to logic zero, for example, by briefly providing an asserted clear signal to the clear inputs of flip-flops 110(1)-110(4). For some embodiments, a global clear signal (not shown for simplicity) may be provided to the clear inputs of flip-flops 110(1)-110(4) to initialize Q1-Q4 to logic zero, for example, as described in U.S. Pat. No. 6,075,418. The logic low signal on Q4 causes OR gate 125 to drive its output on signal line GQ4 to logic one.

A test cycle begins when test-enable signal TE is asserted (e.g., to a logic one). Because line GQ4 carries a logic one, AND gate 130 passes the rising edge from test-enable signal TE to test-clock terminal TCLK (arrow 202), and consequently to the clock terminal of flip-flop 110(1). The rising edge on the clock terminal of flip-flip 110(1) clocks flip-flop 110(1) so that the logic one on input terminal D1 transfers to output terminal Q1 after the clock-to-out delay $D_{Q1}$ associated with flip-flop 110(1) (arrow 204).

The rising edge of signal Q1 does three things. First, the rising edge of signal Q1 clocks flip-flop 110(2) so that the logic one on input D2 transfers to output terminal Q2 after the clock-to-out delay $D_{Q2}$ associated with flip-flop 110(2) (arrow 208). Second, the rising edge of signal Q1 clears flip-flop 110(4). Clearing flip-flop 110(4) has no impact in the first instance of a rising edge on terminal Q1. However, as described below, each subsequent rising edge on test-clock line TCLK occurs when output Q4 of flip-flop 110(4) transitions from logic low to logic high, and thus flip-flop 110(4) must be cleared (e.g., its output reset to logic zero) to prepare TCLK for subsequent rising edges. Third, the rising edge of signal Q1 clocks flip-flop 120 so that test enable signal TE is transferred to output terminal Q0 (arrow 206).

The rising edge on line Q0 produces a falling edge on line GQ4 (arrow 210), which in turn produces a falling edge 212 on line TCLK. Flip-flop 110(1), which is a positive-edge-triggered flip-flop, is unaffected by falling edge 212. Falling edge 212 is important, however, because it prepares flip-flop 110(1) to respond to a subsequent rising clock edge. Line Q0 then remains at logic one for the duration of the test period, or as long as test-enable signal TE is asserted.

The rising edge of signal Q2 clocks flip-flop 110(3) so that the logic one on input D3 transfers to output Q3 after the clock-to-out delay $D_{Q3}$ associated with flip-flop 110(3) (arrow 214). The rising edge of signal Q2 also clears flip-flop 110(1), thereby resetting its output Q1 to logic zero (arrow 216). The resulting rising edge of signal Q3 then clocks flip-flop 110(4) so that the logic one on input D4 transfers to output Q4 after the clock-to-out delay $D_{Q4}$ associated with flip-flop 110(4) (arrow 218). Also, the rising edge of signal Q3 clears flip-flop 110(2) (arrow 220), and in response thereto, the logic low value of Q2 releases the clear terminal of flip-flop 110(2), thereby allowing its output Q2 to rise in response to the subsequent rising edge of Q1 at its CLK input.

Finally, the rising edge on line Q4 clears flip-flop 110(3) (arrow 222) and propagates through OR gate 125 and AND gate 130 to clock flip-flop 110(1) once again (arrows 224, 226, and 228). Oscillator 100 then continues to cycle a pulse through flip-flops 110(1)-110(4) until test-enable line TE returns to logic zero, which causes AND gate 130 to prevent the feedback signal Q4 from flip-flop 110(4) from clocking the logic high D input signal into flip-flop 110(1), thereby terminating the oscillation signal TCLK. In this manner, cycling a pulse through flip-flops 110(1)-110(4) produces an oscillating test signal on test-clock terminal TCLK.

As described above, the enable circuit 115 commences operation of the ring oscillator 110 by pulsing the clock input of the first flip-flop 110(1) to logic high in response to an assertion of TE, propagates the output signal Q4 of the last flip-flop 110(4) to the clock input of the first flip-flop 110(1) via OR gate 125 and AND gate 130 during normal operation of the ring oscillator, and terminates operation of the ring oscillator by forcing the clock input of the first flip-flop 110(1) to logic low in response to a de-assertion of TE. Thus, because the signal path between the last flip-flop 110(4) and the first flip-flop 110(1) passes through enable circuit 115, the period $T_{TCLK}$ of the test signal TCLK of FIG. 1 undesirably includes the gate delays of extraneous logic gates 125 and 130, as well as any additional signal delays along the signal connections employed to route the oscillation signal to enable circuit 115 from the last flip-flop 110(4) and along the signal connections employed to route the oscillation signal from enable circuit 115 to the first flip-flop 110(1). As a result, when using the clock signal TCLK to measure the signal delays through the flip-flops 110(1)-110(4) of ring oscillator 100, the signal delays through the enable circuit 115 and the propagation delays of the associated signal line connections must be accounted for in the period of TCLK to accurately determine the signal delay through the ring-connected flip-flops 110(1)-110(4). Because the exact signal delays through the enable circuit 115 and the associated signal line connections may not be known and/or may be different for various circuit implementations, the inclusion of enable circuit 115 in the delay line of ring oscillator 100 may degrade the accuracy with which the signal delay of the ring-connected flip-flops 110(1)-110(4) can be measured.

Oscillators such as oscillator 100 may be employed to measure signal delays in programmable logic devices such as field programmable gate array (FPGA) devices. An FPGA device typically includes an array of configurable logic blocks (CLBs) surrounded by a plurality of input/output blocks (IOBs). The CLBs are individually programmable to perform a variety of logic functions on a few input signals, and the IOBs can be configured to drive output signals from the CLBs to external pins of the FPGA and/or to receive input signals from the external FPGA pins. The FPGA also includes a programmable interconnect structure or switch matrix that can be programmed to selectively route signals among the various CLBs and IOBs to produce more complex functions of many input signals. Further, the IOBs are typically connected to a global clock distribution network that propagates clock signals across the FPGA device.

More specifically, during test operations, the FPGA device may be configured to measure the clock-to-out delays of flip-flops embedded in various IOBs as well as propagation delays along the global clock distribution network. For example, FIG. 3 illustrates an FPGA device 300 configured using a test pattern that measures the clock-to-out delays of output flip-flops 110 embedded within various IOBs 310 as well as the propagation delays along a clock distribution network 340. Typically, the oscillator's enable circuit 115 is implemented using logic (e.g., a look-up table) in a CLB 320 that is connected to the IOBs 310 via a switch matrix 330, and the IOB's flip-flops 110 are connected in a ring using the global clock distribution network 340, as depicted in FIG. 3. Thus, as illustrated in FIG. 3, the signal path from the output Q4 of flip-flop 110(4) to the clock input of flip-flop 110(1) passes through the enable circuit 115 implemented in CLB 320 via the switch matrix 330. As a result, the period of the oscillator's clock signal TCLK undesirably includes the gate delays of logic gates 125 and 130 of enable circuit 115 as well as the signal delays across the switch matrix 330, thereby reducing the accuracy with which the clock-to-out delays of flip-flops 110 can be measured.

Accordingly, it would be desirable to initiate and terminate operation of oscillators such as oscillator 100 without using a enable circuit that adds unnecessary and/or uncertain signal delays to the delay path of the oscillator.

SUMMARY

An oscillator circuit is disclosed that may be used for measurement of the signal delay through a chain of synchronous elements such as flip-flops. In accordance with embodiments of the present invention, an oscillator having a number of synchronous elements connected in a loop utilizes an enable circuit that is independent of the oscillator's delay path. For some embodiments, the synchronous elements are flip-flops having two asynchronous inputs, a data input, a clock input, and an output, although other synchronous elements may be used.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of measuring various signal propagation delays between a number of synchronous elements connected as a free-running ring oscillator for simplicity only. It is to be understood that aspects of the present invention are equally applicable for measuring signal propagation delays between other synchronous elements, as well as other asynchronous circuits. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 4:
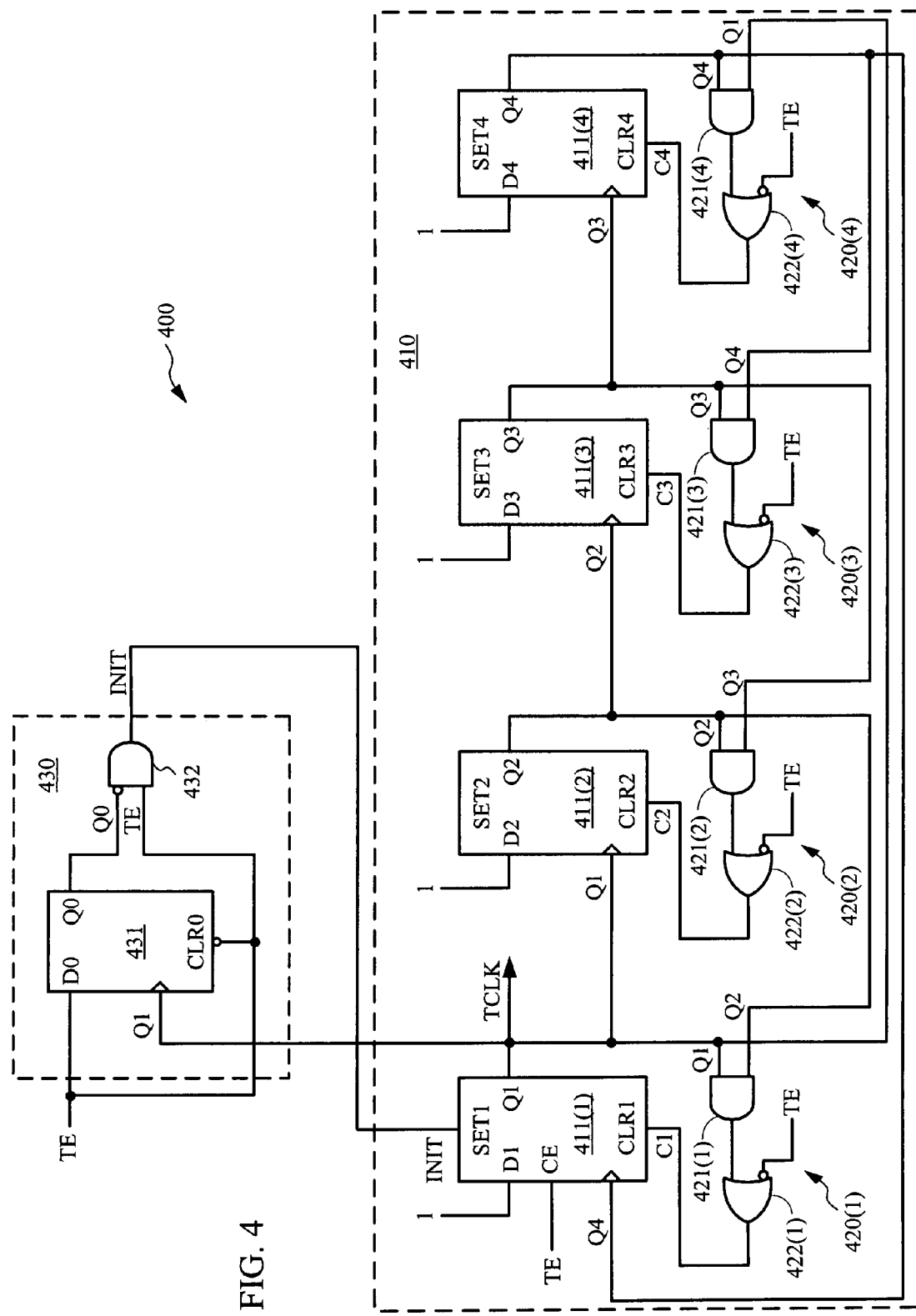
FIG. 4 is a schematic diagram of an oscillator circuit configured to measure the clock-to-out delays of a number of synchronous elements using the rising edges of a clock signal in accordance with some embodiments of the present invention.

FIG. 4 is a schematic diagram of an oscillator circuit 400 in accordance with some embodiments of the present invention. Oscillator circuit 400 includes a ring oscillator 410 and an enable circuit 430. Oscillator 410 includes four synchronous elements 411(1)-411(4) connected as a free-running ring oscillator. For purpose of discussion herein, synchronous elements 411 are shown in FIG. 4 as flip-flops 411(1)-411(4), each having a data input terminal (D), an output terminal (Q), a clock input terminal (>), an asynchronous set input terminal (SET), and an asynchronous clear input terminal (CLR). For other embodiments, synchronous elements 411 may be any other suitable synchronous elements such as, for example, latches. The data input (D) of each flip-flop 411(1)-411(4) is connected to logic "1" (e.g., VDD), and the output (Q) of each flip-flop 411 is connected to the clock input of the next flip-flop 411 in the ring. The asynchronous set terminal (SET) of the first flip-flop 411(1) is coupled to an initialization signal INIT, and the asynchronous set terminals (SET) of the other flip-flops 411(2)-411(4) are coupled to ground potential (ground connections not shown in FIG. 4 for simplicity).

As shown in FIG. 4, the asynchronous clear terminals (CLR) of flip-flops 411(1)-411(4) are coupled to reset circuits 420(1)-420(4), respectively, where each reset circuit 420 asserts the clear signal (C) for the corresponding flip-flop 411 in response to a logical combination of the Q output of the corresponding flip-flop, the Q output of the next flip-flop in the ring, and a test-enable signal (TE). More specifically, each reset circuit 420 includes an AND gate 421 and an OR gate 422. AND gate 421 includes a first input coupled to the Q output of the corresponding flip-flop 411, a second input coupled to the Q output of the next flip-flop in the ring, and an output coupled to a non-inverted input of OR gate 422. OR gate 422 includes an inverted input coupled to TE, and includes an output coupled to the clear terminal of the corresponding flip-flop. Thus, for example, reset circuit 420(0) employs AND gate 421(1) and OR gate 422(1) to logically combine the output Q1 of flip-flop 411(1), the output Q2 of flip-flop 411(2), and TE to generate a clear signal (C1) for flip-flop 411(1). For other embodiments, reset circuits 420(1)-420(4) may be implemented using other logic gates and/or may be generate the clear signals in response to logical combinations of other signals.

Enable circuit 430, which includes a flip-flop 431 and an AND gate 432, generates an initialization signal INIT in response to TE. More specifically, TE is coupled to the input (D0) of flip-flop 431, to an inverted asynchronous clear terminal (CLR0) of flip-flop 431, and to a non-inverted input of AND gate 432. For other embodiments, the input (D0) of flip-flop 431 may be connected to VDD instead of TE. The output Q0 of flip-flop 431 is coupled to an inverted input of AND gate 432, which includes an output to generate INIT. The clock input of flip-flop 431 is coupled to the output Q1 of the first flip-flop 410(1) in the oscillator 410. In accordance with embodiments of the present invention, the INIT signal generated by enable circuit 430 is coupled to the asynchronous set terminal of the first flip-flop 411(1).

For purposes of discussion herein, flip-flops 411(1)-411(4) and 431 are positive-edge-triggered flip-flops. In this manner, flip-flops 411(1)-411(4) and 431 are responsive to rising edges applied to their clock inputs, and are insensitive to falling edges of signals applied to their clock inputs. However, for other embodiments, flip-flops 411(1)-411(4) and/or 431 may be negative-edge-triggered flip-flops that are responsive to falling edges applied to their clock inputs and insensitive to rising edges of signals applied to their clock inputs.

Figure 1:
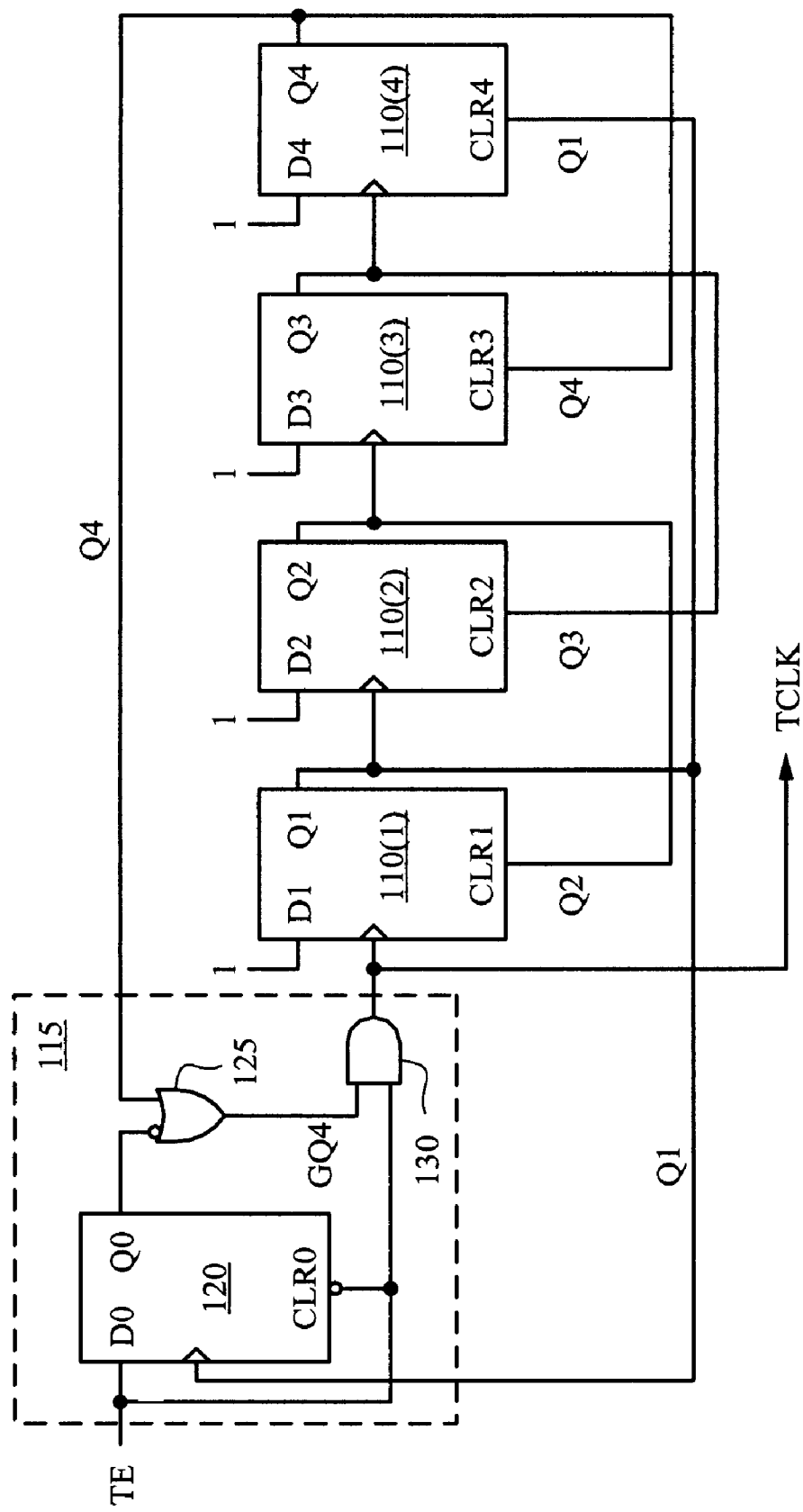
FIG. 1 is a schematic diagram of a prior art oscillator configured to measure the clock-to-out delays of a number of synchronous elements using the rising edges of a clock signal.
Figure 2:
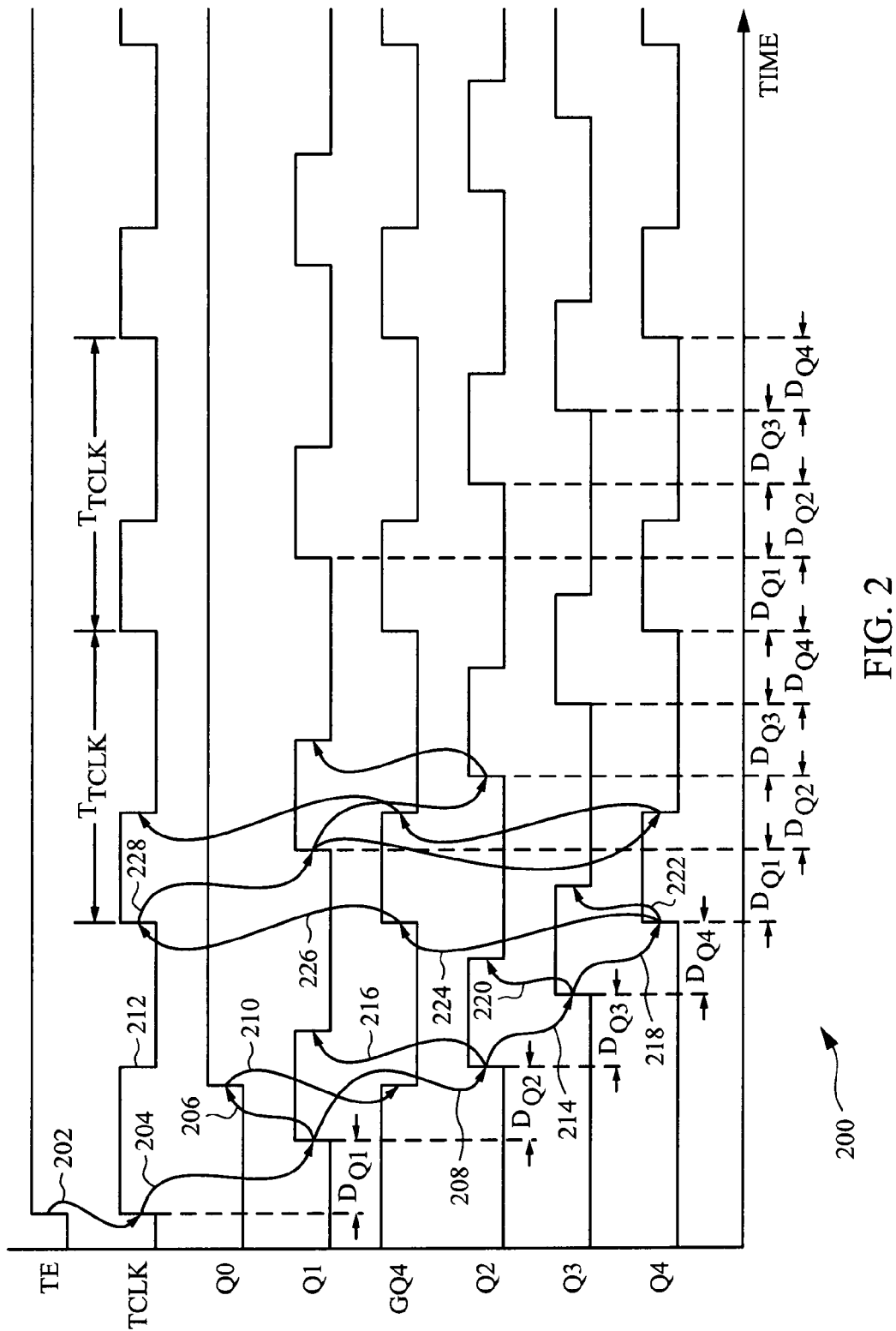
FIG. 2 is a waveform diagram illustrating an exemplary operation of the oscillator of FIG. 1.

In operation, enable circuit 430 asserts INIT in response to an assertion of TE, which signals the beginning of a test cycle. In response to the assertion of INIT, oscillator 410 produces an oscillating test signal TCLK having a period that equals the clock-to-out delays of the four flip-flops 411(1)-411(4) plus the propagation delays along the out-to-clock signal lines connected between the flip-flops 410(1)-410(4). More specifically, because the output Q4 of flip-flop 411(4) is connected to the clock input of flip-flop 411(1) without propagating through enable circuit 430, enable circuit 430 is independent of the delay path of ring oscillator 410, and thus does not affect the period of the ring oscillator's test clock TCLK. Accordingly, in contrast to the prior art oscillator 100 of FIG. 1, the period of TCLK for the ring oscillator 410 of FIG. 4 does not include any gate delays associated with the enable circuit 430 or any signal delays associated with routing signals between enable circuit 430 and ring oscillator 410, thereby allowing for a more accurate measurement of the clock-to-out delays of flip-flops 411(1)-411(4), as compared to prior art oscillator 100 of FIG. 1.

Figure 5:
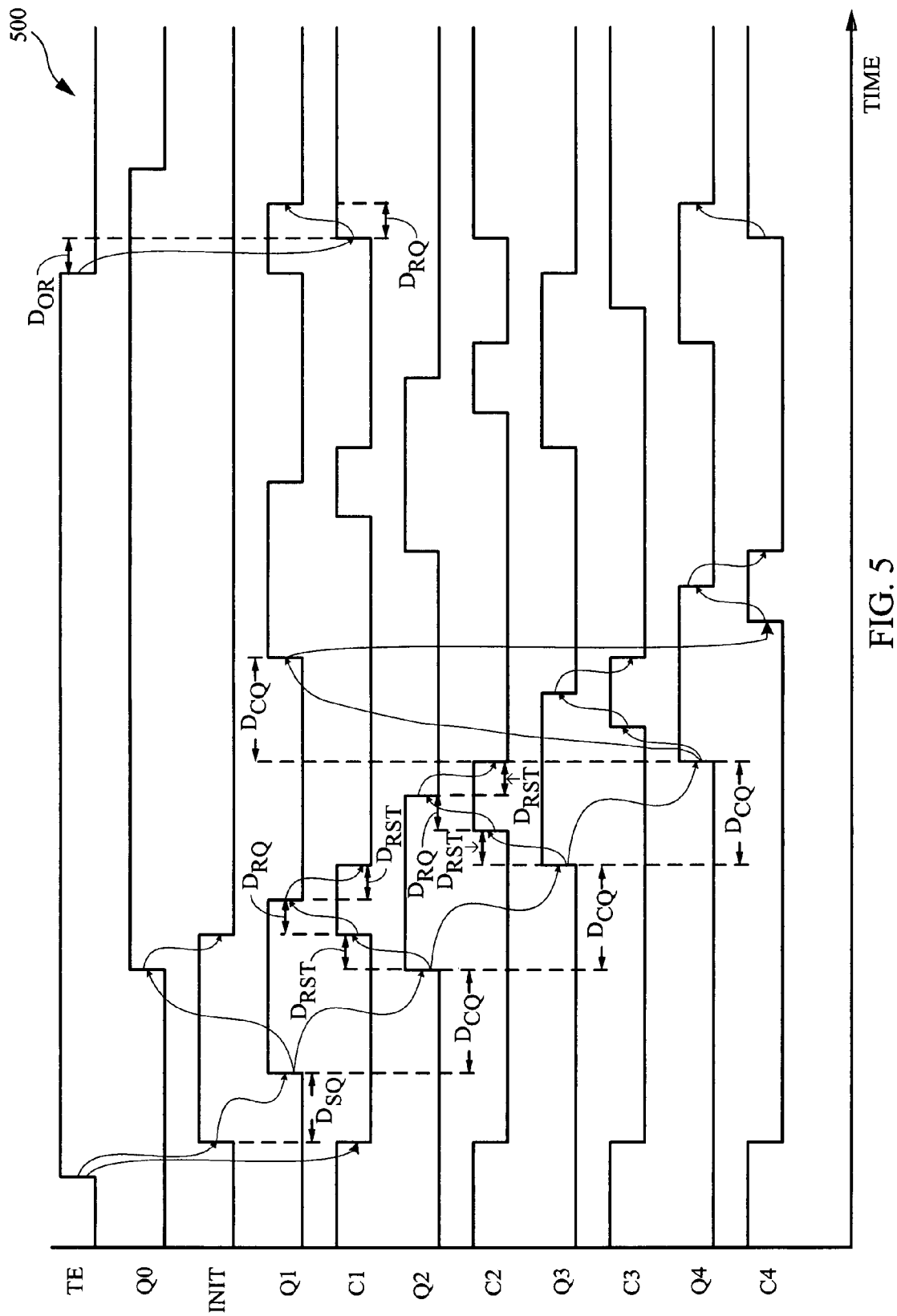
FIG. 5 is a waveform diagram illustrating an exemplary operation of the oscillator of FIG. 4.

A more detailed exemplary operation of oscillator circuit 400 is described below with respect to the illustrative timing diagram of FIG. 5. Each waveform in FIG. 5 is labeled using the corresponding node designation depicted in FIG. 4, and lines terminating with differently named input and output nodes are named for output nodes. For example, the line connecting output terminal. Q2 of flip-flop 411(2) to the clock terminal of flip-flop 411(3) and the reset circuits 420(1)-420(2) is labeled "Q2." The node designations are hereafter used to alternatively refer to circuit nodes or their corresponding signals. In each instance, the interpretation of the node designations as either signals or physical elements will be clear from the context.

Initially, TE is in a logic low state, which causes OR gates 422(1)-422(4) to assert clear signals C1-C4 to logic high, which in turn initializes the respective outputs Q1-Q4 of flip-flops 411(1)-411(4). For other embodiments, a global clear signal (not shown for simplicity) may be provided to the clear inputs of flip-flops 411(1)-411(4) to initialize Q1-Q4 to logic zero, for example, as described in U.S. Pat. No. 6,075, 418. Also, the initial logic low state of TE, which is provided to the inverted clear input terminal of flip-flop 431, initializes the output Q0 of flip-flop 431 to logic low. Further, the initial logic low state of TE causes AND gate 432 to force INIT to an initial logic low state.

A test cycle begins when test-enable signal TE is asserted to logic high. The logic high state of TE causes AND gate 432 to drive INIT to logic high, and also de-asserts the clear signals C1-C4 to logic low. The logic low state of TE releases the output Q0 of flip-flop 431, and the logic low states of C1-C4 release the outputs Q1-Q4 of flip-flops 411(1)-411(4), respectively. The delay between the rising edge of TE and the falling edges of C1-C4 is equal to the gate delay of OR gates 422 ($D_{OR}$), and the delay between the rising edge of TE and the rising edge of INIT is equal to the gate delay of AND gate 432 ($D_{AND}$).

The rising edge of INIT is provided to the asynchronous set input terminal of flip-flop 411(1) and sets the output Q1 of flip-flop 411(1) to logic high after a set-to-out delay of flip-flop 411(1), denoted herein as $D_{SQ}$. Then, the rising edge of signal Q1 clocks flip-flop 411(2) so that the logic one on its input D2 transfers to output terminal Q2 after the clock-to-out delay associated with flip-flop 411(2), herein denoted as $D_{CQ}$. The rising edge of signal Q1 also clocks flip-flop 431 so that the logic one on input D0 transfers to output terminal Q0 after the clock-to-out delay $D_{CQ}$ associated with flip-flop 431. In response to the rising edge of Q0 received at its inverting input, AND gate 432 drives INIT to logic low after a gate delay associated with AND gate 432. The logic low state of INIT releases the output Q1 of flip-flop 411(1) by returning its set input to logic low, thereby allowing Q1 to be responsive to pulses at its clock input.

The rising edge of signal Q2 clocks flip-flop 411(3) so that the logic one on its input D3 transfers to output Q3 after the clock-to-out delay $D_{CQ}$ associated with flip-flop 411(3). Also, the rising edge of signal Q2, when logically combined with the logic high state of Q1 in reset circuit 420(1), forces signal C1 to logic high after a gate delay $D_{RST}$ associated with reset circuit 420(1). Then, the logic high state of C1 resets the output Q1 of flip-flop 411(1) to logic low after a clear-to-out delay $D_{RQ}$ associated with flip-flop 411(1). The resulting logic low state of signal Q1 then causes reset circuit 420(1) to de-assert signal C1 to logic low after a gate delay $D_{RST}$, thereby releasing the output Q1 of flip-flop 411(1).

The rising edge of signal Q3 clocks flip-flop 411(4) so that the logic one on its input D4 transfers to output Q4 after the clock-to-out delay $D_{CQ}$ associated with flip-flop 411(4). Also, the rising edge of signal Q3, when logically combined with the logic high state of Q2 in reset circuit 420(2), forces signal C2 to logic high after a gate delay $D_{RST}$ associated with reset circuit 420(2). Then, the logic high state of C2 resets the output Q2 of flip-flop 411(2) to logic low after a clear-to-out delay $D_{RQ}$ associated with flip-flop 411(2). The resulting logic low state of signal Q2 then causes reset circuit 420(2) to de-assert signal C2 to logic low after a gate delay $D_{RST}$, thereby releasing the output Q2 of flip-flop 411(2).

The rising edge of signal Q4 clocks flip-flop 411(1) so that the logic one on its input D1 transfers to output Q1 after the clock-to-out delay $D_{CQ}$ associated with flip-flop 411(1). Also, the rising edge of signal Q4, when logically combined with the logic high state of Q3 in reset circuit 420(3), forces signal C3 to logic high after a gate delay $D_{RST}$ associated with reset circuit 420(3). Then, the logic high state of C3 resets the output Q3 of flip-flop 411(3) to logic low after a clear-to-out delay $D_{RQ}$ associated with flip-flop 411(3). The resulting logic low state of signal Q3 then causes reset circuit 420(3) to de-assert signal C3 to logic low after a gate delay $D_{RST}$, thereby releasing the output Q3 of flip-flop 411(3).

The rising edge of signal Q1 clocks flip-flop 411(2) so that the logic one on its input D2 transfers to output Q2 after the clock-to-out delay $D_{CQ}$ associated with flip-flop 411(2). Also, the rising edge of signal Q1, when logically combined with the logic high state of Q4 in reset circuit 420(4), forces signal C4 to logic high after a gate delay $D_{RST}$ associated with reset circuit 420(4). Then, the logic high state of C4 resets the output Q4 of flip-flop 411(4) to logic low after a clear-to-out delay $D_{RQ}$ associated with flip-flop 411(4). The resulting logic low state of signal Q4 then causes reset circuit 420(4) to de-assert signal C4 to logic low after a gate delay $D_{RST}$, thereby releasing the output Q4 of flip-flop 411(4).

Ring oscillator 410 continues to cycle a pulse through flip-flops 411(1)-411(4) as long as signal TE remains in its logic high state. To stop operation of the oscillator, the test-enable signal TE is de-asserted to logic low, which clears the output signal Q0 of flip-flop 431 to logic low after a clear-to-out delay $C_{RQ}$ associated with flip-flop 431. The logic low state of TE also asserts the clear signals C1-C4 for flip-flops 411(1)-411(4), respectively, after gate delays $D_{OR}$ associated with OR gates 422. In response to the asserted signals C1-C4, output signals Q1-Q4 are forced to logic low after clear-to-out delays $D_{RQ}$ associated with 411(1)-411(4), respectively.

For the exemplary embodiment of FIG. 4, the test-enable signal TE is also coupled to a clock enable input (CE) of the first flip-flop 411(1). In this manner, when TE is asserted to logic high, the clock input of flip-flop 411(1) is enabled, and when TE is de-asserted to logic low, the clock input of flip-flop 411(1) is disabled. For other embodiments, TE may not be coupled to the CE input of flip-flop 411(1).

As mentioned above, cycling a pulse through flip-flops 411(1)-411(4) produces an oscillating test signal on TCLK having a period that includes the sum of rising edge clock-to-out delays $D_{CQ}$ of flip-flops 411(1)-411(4), as well as the sum of the signal delays along the signal paths connecting the Q output of each flip-flop 411 to the clock input of the next flip-flop 411. For actual embodiments, a counter (not shown for simplicity) may be employed to count the number of periods of TCLK to determine the delay of flip-flops 411(1)-411(4), for example, as described in U.S. Pat. No. 6,075,418.

Because the output Q of the last flip-flop 411(4) is connected directly to the clock input of the first flip-flop 411(1), the enable circuit 430 is independent of the delay path of ring oscillator 410, and thus the period of the oscillator's clock signal TCLK does not include any gate delays associated with circuit elements used to implement enable circuit 430 (e.g., AND gate 432), and does not include any signal delays associated with routing the oscillator's clock signal TCLK between the ring oscillator 410 and the enable circuit 430. More specifically, by pulsing the asynchronous set input of flip-flop 411(1) to commence operation of the oscillator, which allows enable circuit 430 to be independent of the delay path of the ring oscillator 410, ring oscillator 410 may provide more accurate measurements of the clock-to-out delays of flip-flop 411(1)-411(4) than prior art oscillators such as oscillator 100 of FIG. 1.

Referring again to FIGS. 4 and 5, for oscillator circuit 400 to function properly, the signal delay from a rising edge of Q1 to a rising edge of Q0 to a falling edge of INIT must be shorter than the signal delay from a rising edge of Q1 to a rising edge of Q2 to a rising edge of Q3 to a rising edge of C2 to a falling edge of Q2 to a falling edge of C2. This condition will be satisfied unless the clock-to-out delay of flip-flop 431 is very slow, or if the gate delay of AND gate 432 is large enough. If this condition cannot be satisfied, the ring oscillator will not oscillate but rather will stop with Q1 in a logic high state and Q2 in a logic low state.

Further, in normal operation, both INIT and C1 may be logic high at the same time. This condition is acceptable as long as either (1) the set input of flip-flop 411(1) is dominant over its clear input or (2) the clear input of flip-flop 411(1) is dominant over its set input. Otherwise, the output Q1 of flip-flop 411(1) may undesirably toggle between logic high and low states when both INIT and C1 are active (e.g., logic high) at the same time.

Figure 3:
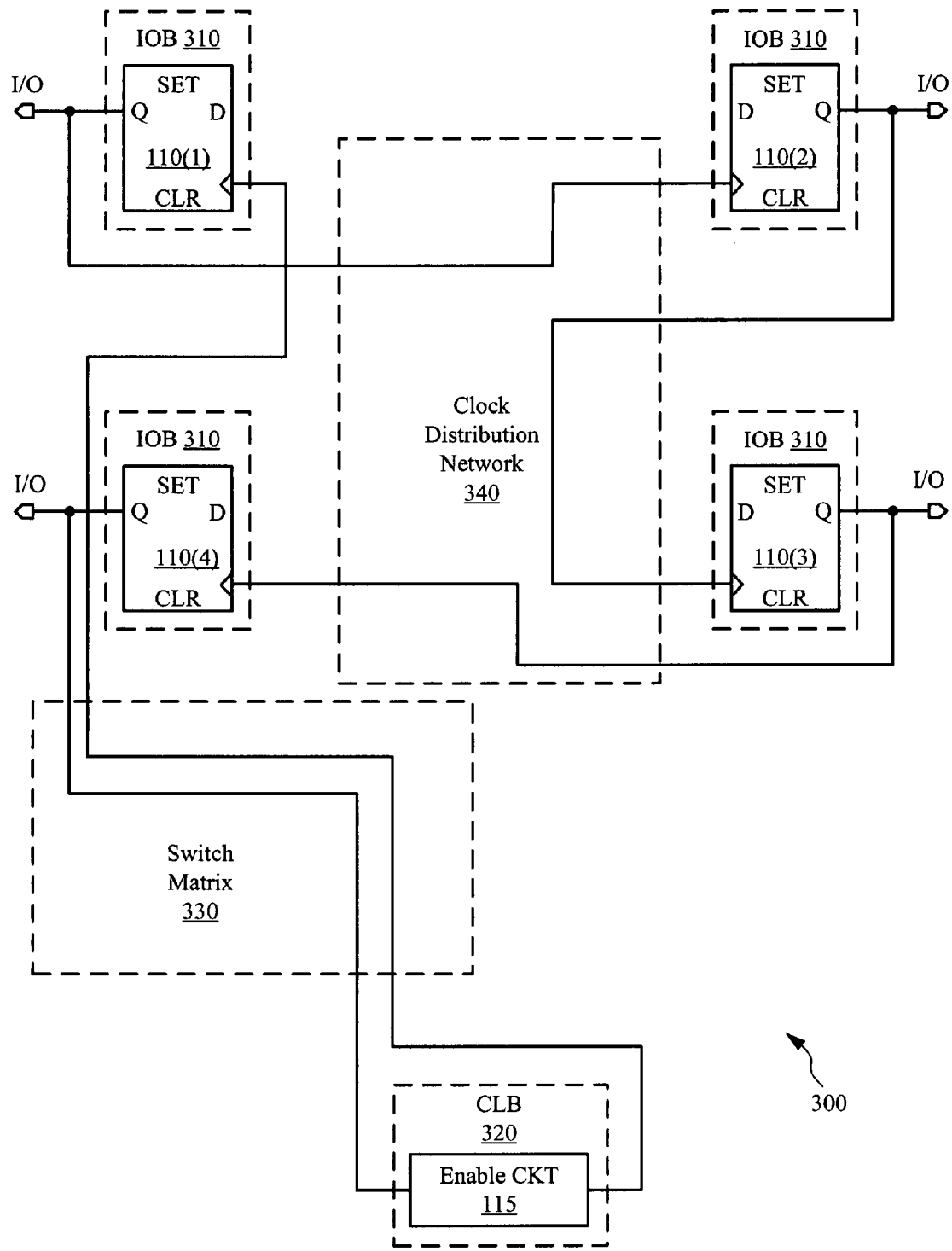
FIG. 3 is a simplified functional block diagram of a programmable IC device configured to implement the oscillator of FIG. 1.
Figure 6:
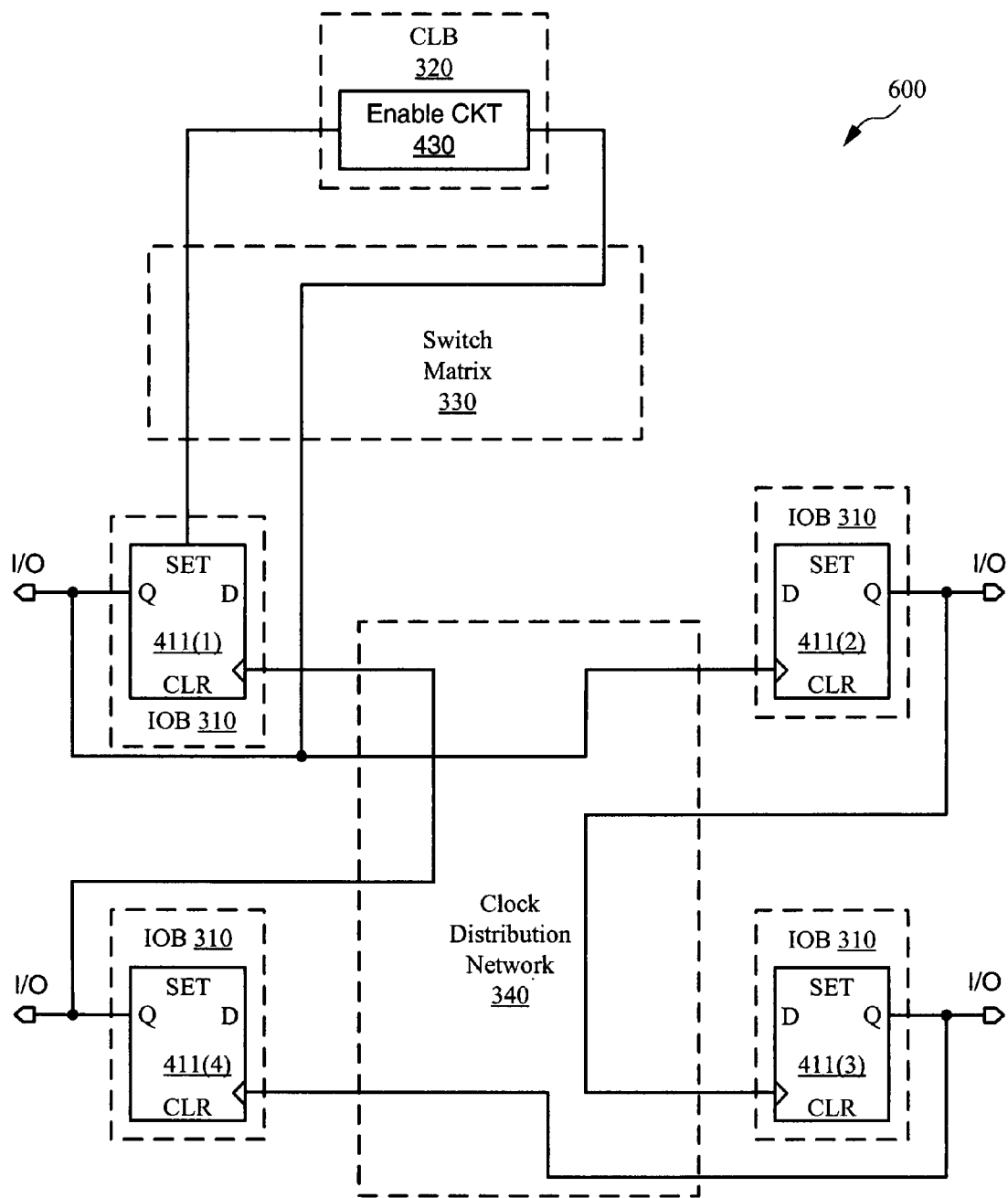
FIG. 6 is a simplified functional block diagram of a programmable IC device configured to implement the oscillator of FIG. 4.

As indicated above, oscillators may be used to measure signal delays in programmable IC devices such as FPGA devices. For example, FIG. 6 shows a simplified functional diagram of an FPGA device 600 configured to measure the clock-to-out delays of a number of flip-flops 411 embedded in various IOBs 310 and the propagation delays along the global clock distribution network 340 during a test operation of FPGA 600. The oscillator's enable circuit 430 is implemented using logic in the CLB 320, which is connected to the IOBs 310 via switch matrix 330, and the IOB's flip-flops 411 are connected in a ring using the global clock distribution network 340. Thus, as depicted in FIG. 6, the output Q4 of flip-flop 411(4) is connected directly to the clock input of flip-flop 411(1), e.g., without passing through enable circuit 430 or the switch matrix 330. As a result, the period of the oscillator's test clock signal TCLK does not include any gate delays associated with enable circuit 430 or any signal delays associated with switch matrix 330, and is therefore more representative of the signal delay through flip-flops 411(1)-411(4) than the prior art implementation of FIG. 3. Indeed, when embodiments of the present invention are used to measure signal delays across IOB flip-flops in an FPGA device such as FPGA device 600 of FIG. 6, enable circuit 430 may be implemented using CLB resources or other logic located anywhere on the FPGA chip without affecting the period of the oscillator test clock signal TCLK.

Figure 7:
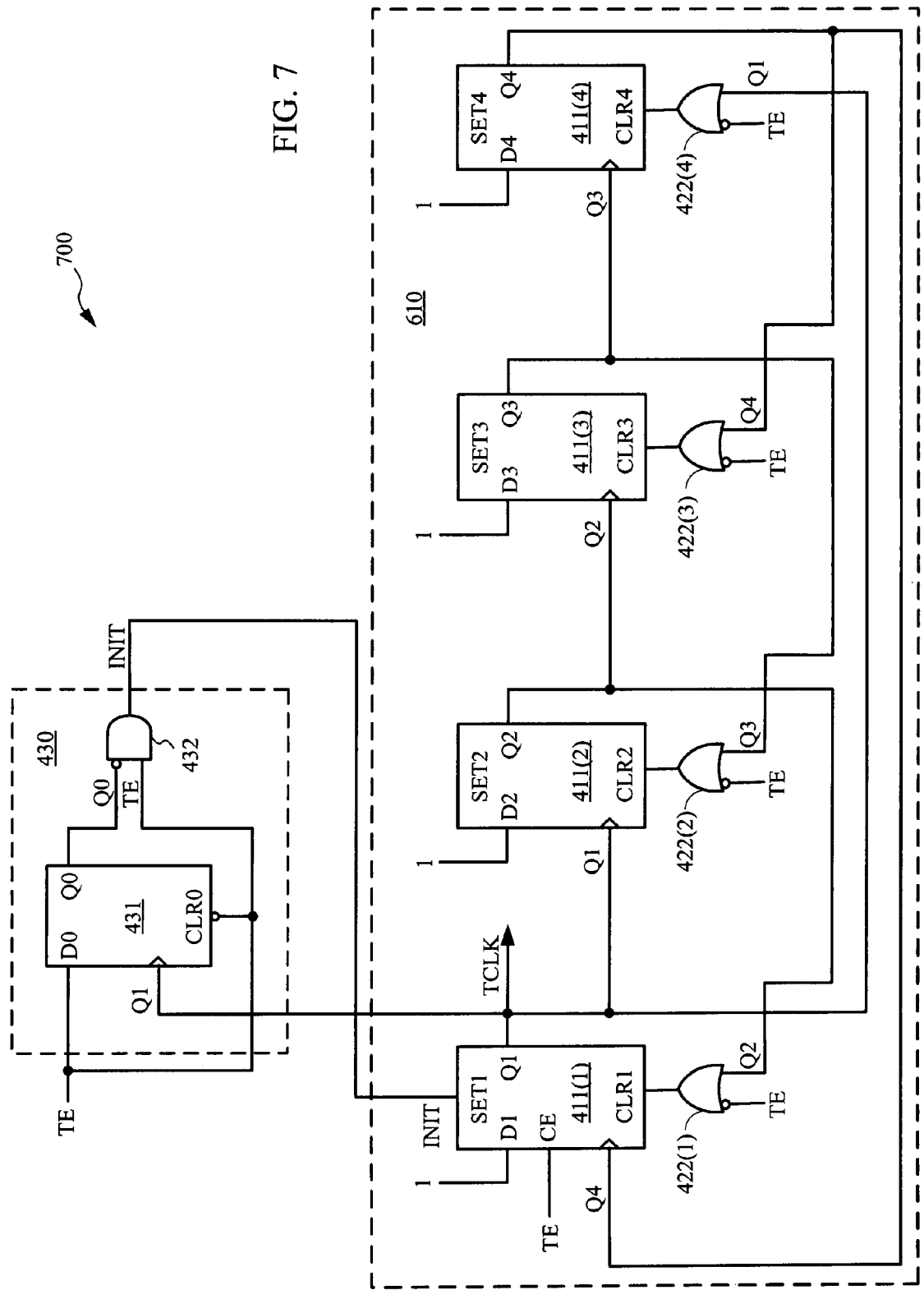
FIG. 7 is a schematic diagram of an oscillator circuit in accordance with other embodiments of the present invention.

Referring again to FIG. 4, AND gates 421(1)-421(4) are included in reset circuits 420(1)-420(4) so that respective clear signals C1-C4 are pulsed to logic high only for a short duration. In this manner, AND gates 421 ensure that the clear signal for each flip-flop 411(1)-411(4) is de-asserted prior to the flip-flop receiving the next rising edge of the test clock signal. To conserve circuit area, AND gates 421(1)-421(4) may be eliminated, as shown in FIG. 7. However, although the embodiment of FIG. 7 reduces circuit area, for example, as compared to oscillator 410 of FIG. 4, the pulse of the clear signals for flip-flops 411 is longer, and therefore for some implementations the clear signals may not be de-asserted in time for the flip-flops 411 to receive the next rising edge of the test clock signal.

Further, although not shown in the embodiments of FIGS. 4 and 7 for simplicity, other embodiments of ring oscillator 410 and/or ring oscillator 610 may also include a flip-flop connected to TCLK to minimize the loading on the TCLK output signal line.

Additionally, for some embodiments, ring oscillators 410 and/or 610 may be employed to measure various signal delays of test circuits inserted between pairs of flip-flops 411(1)-411 (4), for example, as described in U.S. Pat. No. 6,075,418. Thus, although FIGS. 4 and 6 illustrate the output Q4 of flip-flop 411(4) as being connected directly to the clock input of flip-flop 411(1), for other embodiments, the output Q4 of flip-flop 411(4) may be coupled to the clock input of flip-flop 411(1) through one or more test circuits (not shown for simplicity), in which case the period of the test clock TCLK will include the gate delays of such test circuits. Also, although four flip-flops are shown in the examples presented herein, fewer or more flip-flops may be included and tested in the manner described above.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. An oscillator circuit, comprising:
   an enable circuit for generating an initialization signal; and
   a ring oscillator responsive to the initialization signal and including a plurality of synchronous elements connected in a loop, wherein each synchronous element comprises:
      a data input terminal;
      a clock terminal;
      a first asynchronous input terminal; and
      an output terminal directly coupled to the clock terminal of a next synchronous element and coupled to the first asynchronous input terminal of a previous synchronous element,
   wherein the enable circuit is independent of a delay path of the ring oscillator.

2. The oscillator circuit of claim 1, wherein the initialization signal is coupled to a second asynchronous input terminal of a first synchronous element in the loop.

3. The oscillator circuit of claim 2, wherein assertion of the initialization signal sets the output terminal of the first synchronous element to a first predetermined logic state to commence operation of the ring oscillator.

4. The oscillator circuit of claim 2, wherein the first asynchronous input terminal comprises a clear input terminal, and the second asynchronous input terminal comprises a set terminal.

5. The oscillator circuit of claim 1, wherein the output terminal of each synchronous element is connected directly to the clock terminal of the next synchronous element.

6. The oscillator circuit of claim 1, wherein the ring oscillator generates a test clock signal having a period that does not include any signal delays associated with the enable circuit.

7. The oscillator circuit of claim 1, wherein the enable circuit is implemented in a configurable logic block (CLB) of a programmable IC device, and the ring oscillator is implemented in one or more input-output blocks (IOBs) of the programmable IC device.

8. The oscillator circuit of claim 7, wherein the ring oscillator generates a test clock signal having a period that does not include any signal delays associated with the CLB.

9. The oscillator circuit of claim 1, further comprising:
   a plurality of reset circuits, each having an output coupled to the first asynchronous input terminal of a corresponding synchronous element, a first input terminal coupled to the output terminal of the corresponding synchronous element, and a second input terminal coupled to the output terminal of the next synchronous element.

10. The oscillator circuit of claim 1, wherein the first asynchronous input terminals of the synchronous elements are responsive to a test enable signal, and wherein assertion of the test enable signal simultaneously clears the output terminals of the synchronous elements to logic low states.

11. An oscillator circuit, comprising:
   an enable circuit having an output to generate an initialization signal; and a ring oscillator including a plurality of synchronous elements connected in a loop, wherein each synchronous element comprises:
a data input terminal;
a clock terminal;
a set input terminal;
a clear input terminal; and
an output terminal directly coupled to the clock terminal of a next synchronous element and coupled to the clear input terminal of a previous synchronous element,
wherein the initialization signal is coupled to the set input terminal of a first synchronous element in the loop.

12. The oscillator circuit of claim 11, wherein the output terminal of each synchronous element is connected directly to the clock terminal of the next synchronous element.

13. The oscillator circuit of claim 11, wherein the enable circuit is independent of a delay path of the ring oscillator.

14. The oscillator circuit of claim 11, wherein assertion of the initialization signal sets the output terminal of the first synchronous element to a predetermined logic state to commence operation of the ring oscillator.

15. The oscillator circuit of claim 11, further including a plurality of reset circuits, each comprising:
a first input coupled to the output terminal of a corresponding synchronous element, a second input coupled to the output terminal of the next synchronous element, a third input to receive the test enable signal, and an output coupled to the clear terminal of the corresponding synchronous element.

16. The oscillator circuit of claim 11, wherein the ring oscillator generates a test clock signal having a period that does not include any signal delays associated with the enable circuit.

17. The oscillator circuit of claim 11, wherein the enable circuit is implemented in a configurable logic block (CLB) of a programmable IC device, and the ring oscillator is implemented in one or more input-output blocks (IOBs) of the programmable IC device.

18. A programmable integrated circuit (IC) device, comprising:
a configurable logic block (CLB) for implementing an enable circuit that generates an initialization signal; and
a plurality of input-output blocks (IOBs) coupled to each other via a global clock network and to the CLB via a switch matrix, each IOB including at least one synchronous element, the IOBs for implementing a ring oscillator including a plurality of the synchronous elements connected in a loop, wherein each synchronous element comprises:
a synchronous input terminal;
a clock terminal;
a set input terminal;
a clear input terminal; and
an output terminal directly coupled to the clock terminal of a next synchronous element and coupled to the clear input terminal of a previous synchronous element,
wherein the enable circuit is independent of a delay path of the ring oscillator.

19. The programmable IC device of claim 18, wherein the initialization signal is coupled to the set input terminal of a first synchronous element in the loop.

20. The programmable IC device of claim 18, wherein the ring oscillator generates a test clock signal having a period that does not include any signal delays associated with the CLB.

* * * * *